US006869683B2

United States Patent
Sakurai et al.

(10) Patent No.: US 6,869,683 B2
(45) Date of Patent: Mar. 22, 2005

(54) ELECTROMAGNETIC WAVE ABSORBER

(75) Inventors: Ikuo Sakurai, Gunma-ken (JP); Hironao Fujiki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 177 days.

(21) Appl. No.: 10/135,387

(22) Filed: May 1, 2002

(65) Prior Publication Data

US 2003/0044623 A1 Mar. 6, 2003

(30) Foreign Application Priority Data

May 7, 2001 (JP) ........................................ 2001-135773

(51) Int. Cl.[7] .............................................. B32B 9/04
(52) U.S. Cl. ...................... 428/448; 428/447; 524/430; 524/431; 524/439; 524/440; 524/588
(58) Field of Search ................................ 524/688, 430, 524/431, 439, 440; 428/447, 448

(56) References Cited

U.S. PATENT DOCUMENTS

| 5,525,408 A | * | 6/1996 | Weir et al. ................. 428/220 |
| 5,639,989 A | * | 6/1997 | Higgins, III ........... 174/35 MS |
| 6,514,428 B2 | * | 2/2003 | Suzuki et al. ................. 252/74 |
| 2002/0160725 A1 | * | 10/2002 | Toyoda et al. ................. 455/90 |

FOREIGN PATENT DOCUMENTS

| JP | 7-212079 | 8/1995 |
| JP | 3097343 | 8/2000 |
| JP | 2000232296 A | * 8/2000 | ............ H05K/9/00 |

OTHER PUBLICATIONS

"Handbook of Fillers, 2nd Edition"; Wypich, Chem–Tec Publishing 1999–2000, pp 293.*

* cited by examiner

Primary Examiner—Robert Dawson
Assistant Examiner—Marc S Zimmer
(74) Attorney, Agent, or Firm—Birch, Stewart, Kolasch & Birch, LLP

(57) ABSTRACT

An electromagnetic wave (EM) absorber is constructed by integrally laminating an EM-absorbing layer having an EM-absorbing filler dispersed in a silicone resin on at least one surface of an EM-reflecting layer having an electrically conductive filler dispersed in a silicone resin. It has satisfactory EM-absorbing and shielding abilities and is workable, flexible, weather resistant and heat resistant due to the nature of the silicone resin itself. The use of the silicone resin in both the EM-absorbing and reflecting layers ensures that a firm bond is established between the layers. In a preferred embodiment wherein a heat conductive filler is blended, the absorber has a satisfactory heat transfer ability as well.

16 Claims, 2 Drawing Sheets

ELECTROMAGNETIC WAVE ABSORBER

This invention relates to an electromagnetic wave absorber having both electromagnetic wave absorbing and shielding functions.

BACKGROUND OF THE INVENTION

With the ever-increasing utilization of electromagnetic waves in broadcasting, mobile communication, radar, cellular phones, wireless LAN and other systems, more electromagnetic waves are scattering in the ambient atmosphere, frequently giving rise to the problems of electromagnetic wave disturbance and electronic equipment malfunction. One approach for overcoming these problems is to attach electromagnetic wave absorbers to the walls of buildings, bridges and structures providing substantial reflection and scattering of electromagnetic waves and has been effective.

This approach addresses electromagnetic wave absorption in far fields (plane waves). The electromagnetic wave absorber is generally constructed from an electromagnetic wave absorber of rubber or plastics uniformly filled with a magnetic-loss material such as ferrite or a dielectric-loss material such as carbon in powder form, and an electromagnetic wave reflector of a metal or the like disposed on the rear surface of the absorbing material.

An electromagnetic wave absorber is attached to a structure in several ways. In the case of a structure whose surface is made of a metal or the like, an electromagnetic wave absorber without an electromagnetic wave reflector is directly attached to the structure while the structure itself is utilized as an electromagnetic wave reflector. Alternatively, an electromagnetic wave absorber is lined with an electromagnetic wave reflector such as metal foil before it is attached to the structure.

The electromagnetic wave absorber is required to be flexible in order to conform to various shapes of structure to which the absorber is attached. However, prior art electromagnetic wave reflectors lack flexibility because they are usually metal foil, metallized film, metal fibers, carbon fiber fabric, and metallized glass fabric. As a solution to this problem, Japanese Patent No. 3,097,343 discloses a flexible thin-wall electromagnetic wave absorber comprising, in lamination, a flexible sheet-shaped electromagnetic wave absorbing layer composed of a mixture of an electromagnetic energy-loss material and a binder, and a radio wave reflecting layer of an organic fiber fabric having a high conductivity metal material electroless plated thereon.

In these applications, the electromagnetic wave absorber is further required to be resistant to weathering when it is used outdoor. To this end, a protective layer is separately provided on the surface of the electromagnetic wave absorbing layer. For long-term service, a firm bond is required between the electromagnetic wave absorbing layer and the electromagnetic wave reflecting layer. However, it is not technically easy to develop an electromagnetic wave absorber which satisfies all of flexibility, weather resistance, and firm bond between electromagnetic wave absorbing and reflecting layers.

Another electromagnetic wave disturbance is electromagnetic wave disturbance in near fields. A progress has been made for the fabrication to a higher density and higher integration of electronic parts such as CPU, MPU and LSI arranged within personal computers, cellular phones and other electronic equipment and the mounting in a higher density of electronic parts on printed circuit boards. Electromagnetic waves are radiated in the interior of equipment and reflected thereby so that the interior is full of electromagnetic waves, and electromagnetic interference can occur with the electromagnetic wave emitted by the equipment itself.

In the prior art, an artisan with specialized knowledge and experience of noise suppression must be engaged in taking a countermeasure against disturbances by electromagnetic interference. It is a time-consuming task to find an effective countermeasure. Another drawback is that an electronic component in question must be previously given an extra space for mounting a shield. To solve these problems, engineers are interested in electromagnetic absorbers which absorb electromagnetic waves for thereby reducing reflected and transmitted waves.

For preventing electromagnetic waves from leaking out of equipment, it has also been practiced to install metallic plates as the electromagnetic wave shield or to impart electric conductivity to housings for endowing them with an electromagnetic wave shielding function. The electromagnetic waves reflected and scattered by the shield are then confined within the equipment interior, raising the problems of enhanced electromagnetic interference. Electromagnetic interference can occur between substrates mounted within the equipment.

To overcome the above problems, JP-A 7-212079 proposes an electromagnetic interference suppressor comprising an electrically conductive support and an insulating soft magnetic layer laminated thereon and formed of a soft magnetic powder and an organic binder.

The current trend toward a higher density and higher integration of CPU, MPU, LSI and other components used in electronic equipment encounters the problem of increased heat release. Ineffective cooling will cause thermal runaway or undesired effects, giving rise to malfunction. One prior art means for effectively radiating heat to the exterior is to dispose heat transfer media such as silicone grease and silicone rubber filled with heat conductive powder between CPU, MPU or LSI and heat sinks for reducing the contact thermal resistance therebetween. This means, however, cannot avoid the problem of electromagnetic interference within the equipment interior.

Therefore, what is required in the electronic equipment interior, especially at sites where electronic components such as CPU, MPU and LSI are integrated in a high density is a member having all the functions of electromagnetic wave absorption, electromagnetic wave shielding and heat transfer. Members satisfying these three functions are unavailable in the art. In addition to these three functions, the application contemplated herein requires flexibility and heat resistance, and in the case of a multilayer structure including electromagnetic wave absorbing and reflecting layers, firm adhesion between the layers is also needed. Members satisfying these functions at the same time are unavailable in the art.

SUMMARY OF THE INVENTION

An object of the invention is to provide an electromagnetic wave absorber comprising an electromagnetic wave absorbing layer integrally laminated with an electromagnetic wave reflecting layer, having a satisfactory electromagnetic wave absorbing ability as well as workability, flexibility, weather resistance and firm adhesion between the electromagnetic wave absorbing and reflecting layers.

Another object of the invention is to provide an electromagnetic wave absorber comprising an electromagnetic wave absorbing layer integrally laminated with an electromagnetic wave reflecting layer, having a satisfactory electromagnetic wave absorbing ability, electromagnetic wave shielding ability and heat transfer ability, as well as workability, flexibility, heat resistance and firm adhesion between the electromagnetic wave absorbing and reflecting layers.

The inventors have found that by stacking an electromagnetic wave absorbing layer having an electromagnetic wave absorbing filler dispersed in a silicone resin on at least one surface of an electromagnetic wave reflecting layer having an electrically conductive filler dispersed in a silicone resin, there is obtained an electromagnetic wave absorber of the electromagnetic wave reflecting layer integrated structure, having a satisfactory electromagnetic wave absorbing ability as well as workability, flexibility, weather resistance and firm adhesion between the electromagnetic wave absorbing and reflecting layers.

It has also been found that by further incorporating a heat conductive filler in the electromagnetic wave absorbing layer and/or the electromagnetic wave reflecting layer, there is obtained an electromagnetic wave absorber of the electromagnetic wave reflecting layer integrated structure, having a satisfactory electromagnetic wave absorbing ability, electromagnetic wave shielding ability and heat transfer ability, as well as workability, flexibility, heat resistance and firm adhesion between the electromagnetic wave absorbing and reflecting layers.

The invention provides an electromagnetic wave absorber comprising an electromagnetic wave reflecting layer having an electrically conductive filler dispersed in a silicone resin. An electromagnetic wave absorbing layer having an electromagnetic wave absorbing filler dispersed in a silicone resin is laminated on at least one surface of the reflecting layer. In a preferred embodiment, the electromagnetic wave reflecting layer and/or the electromagnetic wave absorbing layer further contains a heat conductive filler.

DESCRIPTION OF THE PREFERRED EMBODIMENT

Figure 1:
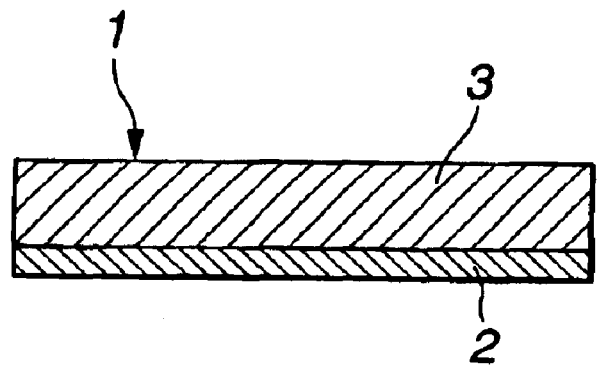
FIG. 1 is a cross-sectional view of an electromagnetic wave absorber according to one embodiment of the invention.
Figure 2:
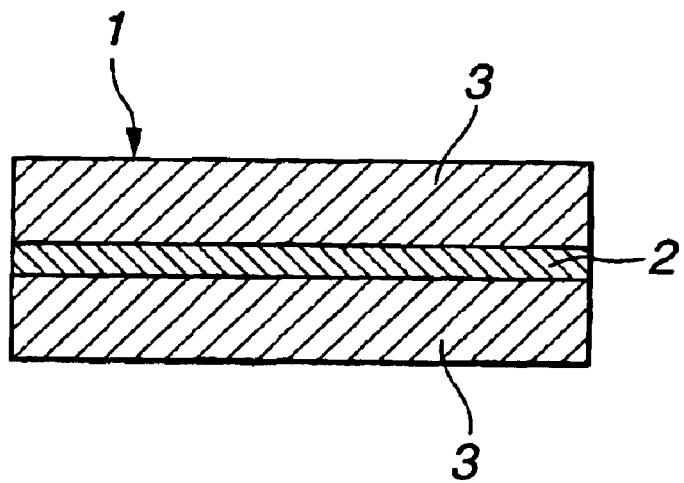
FIG. 2 is a cross-sectional view of an electromagnetic wave absorber according to another embodiment of the invention.

Referring to FIGS. 1 and 2, there are illustrated different embodiments of the electromagnetic wave absorber of the invention. The electromagnetic wave absorber 1 is shown in FIG. 1 as having an electromagnetic wave absorbing layer 3 laminated on one surface of an electromagnetic wave reflecting layer 2. The electromagnetic wave absorber 1 is shown in FIG. 2 as having electromagnetic wave absorbing layers 3 and 3 laminated on either surface of an electromagnetic wave reflecting layer 2.

Using a silicone resin as a dispersing medium for an electrically conductive filler, an electromagnetic wave absorbing filler, and a heat conductive filler, the invention is successful in providing an electromagnetic wave absorber having workability, flexibility, weather resistance and heat resistance. Since the silicone resin has excellent weather resistance and heat resistance as compared with other plastics and rubber, the electromagnetic wave absorber has improved weather resistance and heat resistance. Due to the improved weather resistance, the inventive absorber eliminates a need for a surface protective layer even when it is installed outdoor. Since the silicone resin is used in both the electromagnetic wave reflecting and absorbing layers, the inventive absorber can establish a firm bond between the layers.

The silicone resin used in the electromagnetic wave reflecting and absorbing layers of the inventive absorber may be selected from unvulcanized putty silicone compositions, silicone gels, and silicone rubbers such as addition reaction type silicone rubbers and peroxide crosslinking type silicone rubbers, though not limited thereto.

Where a heat transfer function is necessary, the rubber used is desired to have lower cured hardness for improving the physical contact of the inventive absorber with an electronic component or heat sink for reducing the contact thermal resistance therebetween. In this regard, low hardness type silicone rubber, silicone gel and unvulcanized putty silicone compositions are preferred. Once cured, the rubber preferably has an Asker C hardness of up to 80, especially up to 50.

The base polymer in the unvulcanized putty silicone compositions, uncured silicone rubber compositions and silicone gel compositions may be any of well-known organopolysiloxanes. The organopolysiloxanes used herein include those having the average compositional formula (1) below.

$$R^1_n SiO_{(4-n)/2} \qquad (1)$$

In formula (1), $R^1$, which may be the same or different, stands for substituted or unsubstituted monovalent hydrocarbon radicals, preferably having 1 to 10 carbon atoms, more preferably 1 to 8 carbon atoms, for example, unsubstituted monovalent hydrocarbon radicals including alkyl radicals such as methyl, ethyl, isopropyl, butyl, isobutyl, tert-butyl, hexyl and octyl; cycloalkyl radicals such as cyclohexyl; alkenyl radicals such as vinyl and allyl; aryl radicals such as phenyl and tolyl; aralkyl radicals such as benzyl, phenylethyl and phenylpropyl; and substituted monovalent hydrocarbon radicals including the foregoing radicals in which some or all of the hydrogen atoms attached to carbon atoms are substituted with halogen atoms, cyano and other radicals, for example, halogenated alkyl radicals and cyano-substituted alkyl radicals such as chloromethyl, bromoethyl and cyanoethyl. Of these, methyl, phenyl, vinyl and trifluoropropyl radicals are preferable. More preferably methyl accounts for at least 50 mol %, especially at least 80 mol % of the $R^1$ radicals. The letter n is a positive number from 1.98 to 2.02. Preferably the organopolysiloxane has at least two alkenyl radicals per molecule, especially with the alkenyl radicals accounting for 0.001 to 5 mol % of the $R^1$ radicals.

The organopolysiloxane of formula (1) may have any molecular structure and is preferably blocked at ends of its molecular chain with triorganosilyl radicals or the like, especially diorganovinylsilyl radicals such as dimethyl vinylsilyl. In most cases, the organopolysiloxane is preferably a linear one although it may partially include a branched or cyclic structure. A mixture of two or more different molecular structures is acceptable.

The organopolysiloxane preferably has an average degree of polymerization of 100 to 100,000, especially 100 to 2,000, and a viscosity of 100 to 100,000,000 centistokes at 25° C., especially 100 to 100,000 centistokes at 25° C.

When the above silicone rubber composition is formulated to the addition reaction type, the organopoly-siloxane is one having at least two alkenyl radicals such as vinyl radicals per molecule, and the curing agent is a combination of an organohydrogenpolysiloxane and an addition reaction catalyst.

The organohydrogenpolysiloxane is preferably of the following average compositional formula (2):

$$R^2_a H_b SiO_{(4-a-b)/2} \tag{2}$$

wherein $R^2$ is a substituted or unsubstituted monovalent hydrocarbon radical of 1 to 10 carbon atoms, the subscript "a" is a number from 0 to 3, especially from 0.7 to 2.1, and "b" is a number from more than 0 to 3, especially from 0.001 to 1, satisfying $0 < a+b \leq 3$, especially $0.8 \leq a+b \leq 3.0$. This organohydrogenpolysiloxane is liquid at room temperature.

In formula (2), $R^2$ stands for substituted or unsubstituted monovalent hydrocarbon radicals of 1 to 10 carbon atoms, especially 1 to 8 carbon atoms, examples of which are the same as exemplified above for $R^1$, preferably those free of aliphatic unsaturation, and include alkyl, aryl, aralkyl and substituted alkyl radicals, such as methyl, ethyl, propyl, phenyl, and 3,3,3-trifluoropropyl among others. The molecular structure may be straight, branched, cyclic or three-dimensional network. The silicon atom-bonded hydrogen atoms (i.e., SiH radicals) may be positioned at molecular chain ends or side chains or both. The molecular weight is not critical although the viscosity is preferably in the range of 1 to 1,000 centistokes at 25° C., especially 3 to 500 centistokes at 25° C.

Illustrative, non-limiting, examples of the organohydrogenpolysiloxane include 1,1,3,3-tetramethyldisiloxane, methylhydrogen cyclic polysiloxane, methyl hydrogensiloxane/dimethylsiloxane cyclic copolymers, both end trimethylsiloxy-blocked methylhydrogenpolysiloxane, both end trimethylsiloxy-blocked dimethylsiloxane/methylhydrogen-siloxane copolymers, both end dimethylhydrogensiloxy-blocked dimethylpolysiloxane, both end dimethylhydrogensiloxy-blocked dimethylsiloxane/methylhydrogensiloxane copolymers, both end trimethylsiloxy-blocked methylhydrogen-siloxane/diphenylsiloxane copolymers, both end trimethylsiloxy-blocked methylhydrogensiloxane/diphenyl-siloxane/dimethylsiloxane copolymers, copolymers comprising $(CH_3)_2HSiO_{1/2}$ units and $SiO_{4/2}$ units, copolymers comprising $(CH_3)_2HSiO_{1/2}$ units, $(CH_3)_3SiO_{1/2}$ units and $SiO_{4/2}$ units, and copolymers comprising $(CH_3)_2HSiO_{1/2}$ units, $SiO_{4/2}$ units and $(C_6H_5)_3SiO_{1/2}$ units.

The organohydrogenpolysiloxane is preferably blended in the base polymer in such amounts that the ratio of the number of silicon atom-bonded hydrogen atoms (i.e., SiH radicals) on the organohydrogenpolysiloxane to the number of silicon atom-bonded alkenyl radicals on the base polymer may range from 0.1:1 to 3:1, more preferably from 0.2:1 to 2:1. Within the range, at a lower ratio, a silicone gel forms upon curing; at a higher ratio, a silicone rubber forms upon curing.

The addition reaction catalyst used herein is typically a platinum group metal catalyst. Use may be made of platinum group metals in elemental form, and compounds and complexes containing platinum group metals as the catalytic metal. Illustrative examples include platinum catalysts such as platinum black, platinic chloride, chloroplatinic acid, reaction products of chloroplatinic acid with monohydric alcohols, complexes of chloroplatinic acid with olefins, and platinum bisacetoacetate; palladium catalysts such as tetrakis(triphenylphosphine)palladium and dichlorobis(triphenylphosphine)palladium; and rhodium catalysts such as chlorotris(triphenylphosphine)rhodium and tetrakis(triphenylphosphine)rhodium. The addition reaction catalyst may be used in a catalytic amount, which is often about 0.1 to 1,000 ppm, more preferably about 1 to 200 ppm of platinum group metal, based on the weight of the alkenyl radical-containing organopolysiloxane. Less than 0.1 ppm of the catalyst may be insufficient for the composition to cure whereas more than 1,000 ppm of the catalyst is often uneconomical.

In the other embodiment wherein the silicone rubber composition is of the peroxide curing type, organic peroxides are used as the curing agent. The organic peroxide curing is useful when the organopolysiloxane as the base polymer is a gum having a degree of polymerization of at least 3,000. The organic peroxides used may be conventional well-known ones, for example, benzoyl peroxide, 2,4-dichlorobenzoyl peroxide, p-methylbenzoyl peroxide, o-methylbenzoyl peroxide, 2,4-dicumyl peroxide, 2,5-dimethyl-bis(2,5-t-butylperoxy)hexane, di-t-butyl peroxide, t-butyl perbenzoate, 1,1-bis(t-butylperoxy)-3,3,5-trimethylcyclohexane, and 1,6-bis(t-butylperoxycarboxy)-hexane. An appropriate amount of the organic peroxide blended is about 0.01 to 10 parts by weight per 100 parts by weight of the organopolysiloxane as the base polymer.

For the purpose of improving wetting of an electrically conductive filler, an electromagnetic wave absorbing filler, and a heat conductive filler with the silicone resin for thereby increasing the amount of the fillers loaded and enhancing the strength of the resulting electromagnetic wave absorber, it is preferred to add a surface treating agent for the fillers to the silicone resin. Any of conventional surface treating agents or mixtures thereof may be used.

In addition to the above components, the silicone resin may further include well-known components.

Any desired method may be used in stacking the electromagnetic wave reflecting layer and the electromagnetic wave absorbing layer to construct the electromagnetic wave absorber according to the invention. Exemplary, non-limiting, methods include a method of stacking an uncured form of the electromagnetic wave absorbing layer on a cured form of the electromagnetic wave reflecting layer, followed by curing of the absorbing layer; a method of stacking an uncured form of the electromagnetic wave reflecting layer on a cured form of the electromagnetic wave absorbing layer, followed by curing of the reflecting layer; and a method of stacking an uncured form of the electromagnetic wave absorbing layer on an uncured form of the electromagnetic wave reflecting layer, the layers having a predetermined thickness, followed by simultaneous curing of both the layers. Where an unvulcanized putty silicone composition is used, the curing step is unnecessary.

Since both the electromagnetic wave reflecting and absorbing layers in the electromagnetic wave absorber of the invention are based on the silicone resin, a firm bond can be established between the layers simply by stacking both the layers one on the other. If desired, either one or both of the mating surfaces of the reflecting and absorbing layers are treated with a primer in the form of an organohydrogenpolysiloxane, a silane coupling agent or a condensate thereof.

For the electromagnetic wave absorbing filler in the electromagnetic wave absorbing layer of the inventive electromagnetic wave absorber, use may be made of powdery or fibrous dielectric-loss materials such as carbon and graphite, and powdery magnetic-loss materials such as soft magnetic ferrite, hard magnetic ferrite and soft magnetic metals. A choice may be made among these, depending on the frequency region of electromagnetic wave to be absorbed.

The preferred electromagnetic wave absorbing fillers are soft magnetic alloys containing at least 15% by volume of iron, and ferrite.

Illustrative, non-limiting examples of the soft magnetic ferrite include spinel ferrites such as $MnFe_2O_4$, $CoFe_2O_4$, $NiFe_2O_4$, $CuFe_2O_4$, $ZnFe_2O_4$, $MgFe_2O_4$, $Fe_3O_4$, Cu—Zn-ferrite, Ni—Zn-ferrite, and Mn—Zn-ferrite; and ferrox planar (Y and Z type) hexagonal ferrites such as $Ba_2Me_2Fe_{12}O_{22}$ wherein Me is Co, Ni, Zn, Mn, Mg or Cu, and $Ba_3CO_2Fe_{24}O_{41}$.

Illustrative, non-limiting examples of the hard magnetic ferrite include magnetoplumbite (M type) hexagonal ferrites such as $BaFe_{12}O_{19}$ and $SrFe_{12}O_{19}$.

Illustrative, non-limiting, examples of the soft magnetic metal include Fe—Cr, Fe—Si, Fe—Ni, Fe—Al, Fe—Co, Fe—Al—Si, Fe—Cr—Si, and Fe—Si—Ni alloys.

The electromagnetic wave absorbing filler may be of one type or a mixture of two or more types. The powder particles may be either of flat or granular shape or a mixture thereof.

The powder (particles) serving as the electromagnetic wave absorbing filler should preferably have a mean particle size of about 0.1 $\mu$m to about 100 $\mu$m and especially about 1 $\mu$m to about 50 $\mu$m. Particles with a particle size of less than 0.1 $\mu$m have too large a specific surface area, probably failing to achieve a high packing density. With a particle size of more than 100 $\mu$m, fine asperities may develop on the surface of the electromagnetic wave absorber, and the contact thermal resistance may become high when the heat transfer ability is necessary.

In a preferred embodiment, the electromagnetic wave absorbing filler is blended in an amount to account for 5 to 80%, especially 20 to 70% by volume of the entire electromagnetic wave absorbing layer of the electromagnetic wave absorber. Less than 5% by volume of the filler may fail to impart the desired electromagnetic wave absorbing ability whereas more than 80% by volume may result in an electromagnetic wave absorbing layer which is brittle.

For the electrically conductive filler in the electromagnetic wave reflecting layer of the inventive electromagnetic wave absorber, use may be made of metal, metallized composite and carbon base electrically conductive fillers.

Illustrative, non-limiting, examples of the metal base filler include aluminum, zinc, iron, copper, nickel, silver, gold, palladium and stainless steel in powder, flake or fiber form.

Illustrative, non-limiting, examples of the metallized composite filler include gold-coated silica, silver-coated silica, aluminum-coated glass beads, silver-coated glass beads, nickel-coated glass fibers and nickel-coated carbon fibers.

Illustrative, non-limiting, examples of the carbon base filler include carbon black species such as acetylene black and Ketjen Black, and carbon fibers such as PAN-based carbon fibers and pitch-based carbon fibers.

The electrically conductive filler may be of one type or a mixture of two or more types.

In a preferred embodiment, the electrically conductive filler is blended in an amount to account for 5 to 80%, especially 20 to 70% by volume of the entire electromagnetic wave reflecting layer of the electromagnetic wave absorber. Less than 5% by volume of the filler may fail to impart the desired electromagnetic wave reflecting ability whereas more than 80% by volume may result in an electromagnetic wave reflecting layer which is brittle.

When the inventive electromagnetic wave absorber is used in an area where heat transfer is necessary, a heat conductive filler is desirably incorporated in the electromagnetic wave absorbing and/or reflecting layer in order to provide a high heat transfer capability.

The heat conductive filler used herein is typically selected from metals such as copper and aluminum, metal oxides such as alumina, silica, magnesia, red iron oxide, beryllia, and titania, metal nitrides such as aluminum nitride, silicon nitride and boron nitride, and silicon carbide, though not limited thereto.

Preferably the powder (particles) serving as the heat conductive filler has a mean particle size of about 0.1 $\mu$m to about 100 $\mu$m, especially about 1 $\mu$m to about 50 $\mu$m. Particles with a particle size of less than 0.1 $\mu$m have too large a specific surface area, probably failing to achieve a high packing density. With a particle size of more than 100 $\mu$m, fine asperities may develop on the surface of the absorber, and the contact thermal resistance may become large.

The heat conductive filler is used for the purposes of achieving closer packing with the electromagnetic wave absorbing or reflecting filler and increasing the thermal conductivity of the silicone resin composition. The amount of the heat conductive filler is preferably 10 to 85% by volume of the entire composition. The amount of the electromagnetic wave absorbing or reflecting filler and the heat conductive filler combined is preferably 15 to 90%, especially 30 to 80% by volume of the entire composition. If the amount of the electromagnetic wave absorbing or reflecting filler and the heat conductive filler combined is less than 15 vol %, little improvement in thermal conductivity is made. If the amount of the electromagnetic wave absorbing or reflecting filler and the heat conductive filler combined exceeds 90 vol %, the composition may become very brittle.

Preferably the electromagnetic wave absorbing layer of the inventive electromagnetic wave absorber has a volume resistivity of at least $1\times10^2$ $\Omega$m. A volume resistivity of less than $1\times10^2$ $\Omega$m leaves a likelihood of short-circuiting through the inventive electromagnetic wave absorber when the electromagnetic wave absorber is used in direct contact with an electronic component in an electronic equipment, which can cause a failure of the component.

It is understood that the thickness of the electromagnetic wave reflecting and absorbing layers is properly selected depending on the frequency to be absorbed, the material used and other factors. Preferably, the electromagnetic wave reflecting layer has a thickness of 10 to 3,000 $\mu$m, especially 30 to 1,000 $\mu$m; and the electromagnetic wave absorbing layer has a thickness of 30 $\mu$m to 100 mm, especially 50 $\mu$m to 10 mm.

The electromagnetic wave absorber of the invention, when attached to a surface of a structure that would otherwise provide substantial reflection and scattering of electromagnetic waves, is effective for suppressing unnecessary electromagnetic waves in the ambient atmosphere, thereby overcoming the ghost problem of television and radar systems. When installed in electronic equipment, the electromagnetic wave absorber of the invention is effective for suppressing electromagnetic noise within the electronic equipment and reducing the leakage of electromagnetic waves to the exterior. In a further application wherein a sheet of the electromagnetic wave absorbing silicone resin composition endowed with a heat transfer capability according to the invention is disposed between an electronic component and a heat sink in an electronic equipment, the sheet is effective for suppressing electromagnetic noise and promoting heat transfer from the electronic component to the heat sink and hence, to the exterior.

The electromagnetic wave absorber constructed by integrally laminating an electromagnetic wave reflecting layer of a silicone resin having an electrically conductive filler dispersed therein and an electromagnetic wave absorbing layer of a silicone resin having an electromagnetic wave absorbing filler dispersed therein according to the invention has a satisfactory electromagnetic wave absorbing ability and electromagnetic wave shielding ability and is effectively workable, flexible, weather resistant and heat resistant due to the nature of the silicone resin itself. The use of the silicone resin in both the electromagnetic wave absorbing and reflecting layers ensures that a firm bond is established between the layers. In a preferred embodiment wherein a heat conductive filler is additionally blended, the electromagnetic wave absorber has a satisfactory heat transfer ability as well.

The electromagnetic wave absorber of the invention, when attached to a surface of an outdoor structure that would otherwise provide substantial reflection and scattering of electromagnetic waves, maintains an electromagnetic wave absorbing ability over a long period of time without a need for a surface protective layer, thereby overcoming the ghost problem of television and radar systems.

Placement of the electromagnetic wave absorber in an electronic equipment suppresses electromagnetic noise constantly over a long period of time. When the absorber is additionally given a heat transfer ability, it also allows the heat generated by an electronic component (e.g., CPU, MPU and LSI) to dissipate to the exterior, preventing the electronic component from malfunction.

EXAMPLE

Examples of the invention are given below by way of illustration and not by way of limitation. EM is an abbreviation of electromagnetic wave.

Examples 1–5

An EM absorber of the two layer structure was fabricated as follows which included an EM-reflecting layer formed of a silicone resin having an electrically conductive filler and a heat conductive filler dispersed therein and an EM-absorbing layer formed of a silicone resin having an EM-absorbing filler and a heat conductive filler dispersed therein.

A liquid composition of the addition reaction type was prepared using 100 parts by weight of a vinyl-containing dimethylpolysiloxane blocked at either end with a dimethyl vinylsiloxy radical and having a viscosity of 30 Pa·s at room temperature as the base oil. An organopolysiloxane containing silicon atom-bonded alkoxy radicals as the surface treating agent for an electrically conductive filler and a heat conductive filler was added to the base oil in an amount of 1 part per 100 parts by weight of the electrically conductive filler and heat conductive filler combined. Then the electrically conductive filler and heat conductive filler were added to the base oil in the amounts shown in Table 1. The mixture was agitated and mixed at room temperature. With agitation and mixing continued, the mixture was heat treated at 120° C. for 1 hour, obtaining a base silicone composition for the EM-reflecting layer.

Next, 2 parts by weight of an organohydrogenpolysiloxane having at least two silicon atom-bonded hydrogen atoms in a molecule, 0.3 part by weight of a 2% alcohol solution of a platinum group metal catalyst, and 0.5 part by weight of an acetylene alcohol reaction regulator were added to the base silicone composition. By thoroughly mixing them and press molding the composition while heat curing at 120° C. for 10 minutes, a sheet having a predetermined thickness serving as the EM-reflecting layer was obtained.

A base silicone composition for the EM-absorbing layer was prepared as above except that the electrically conductive filler was replaced by an EM-absorbing filler and the heat conductive filler was added only when necessary. Next, 3 parts by weight of the organohydrogenpolysiloxane, 0.3 part by weight of the 2% alcohol solution of a platinum group metal catalyst, and 0.5 part by weight of the acetylene alcohol reaction regulator were added to the base silicone composition. Mixing yielded a silicone composition in uncured state serving as the EM-absorbing layer.

The organohydrogenpolysiloxane was applied to one surface of the EM-reflecting layer, and the silicone composition in uncured state serving as the EM-absorbing layer was laid thereon and cured thereto. An EM absorber of the integrated two-layer structure was obtained, which consisted of the EM-absorbing layer and the EM-reflecting layer as shown in FIG. 1, and had a heat transfer ability as well.

The composition and thickness of the EM-absorbing layer and the EM-reflecting layer are shown in Table 1.

Examples 6–10

An EM absorber of the integrated three-layer structure consisting of the EM-absorbing layers on either surface of the EM-reflecting layer as shown in FIG. 2 was obtained by following the procedure of Examples 1–5 except that the EM-absorbing layer was formed on each surface of the EM-reflecting layer.

The composition and thickness of the EM-absorbing layer and the EM-reflecting layer are shown in Table 1.

Comparative Example 1

By using a 24-mesh stainless steel screen as the EM-reflecting layer, and coating a thermoplastic polyurethane rubber filled with an EM-absorbing filler to each surface of the screen to form EM-absorbing layers, an EM absorber of the three-layer structure was obtained.

The composition and thickness of the EM-absorbing layer and the EM-reflecting layer are shown in Table 1.

TABLE 1

| Layer construction | Example 1 | 2 | 3 | 4 | 5 | 6 | 7 | 8 | 9 | 10 | CE 1 |
|---|---|---|---|---|---|---|---|---|---|---|---|
| EM-absorbing layer | | | | | | | | | | | |
| *EM-absorbing filler* | | | | | | | | | | | |
| Composition | stainless steel | stainless steel | Fe-Si | Sendust | Mn—Zn ferrite | stainless steel | stainless steel | Fe—Si | Sendust | Mn—Zn ferrite | Sendust |
| Shape | flat | sphere | flat | granule | granule | flat | sphere | flat | granule | granule | flat |
| Size (μm) | 20 | 20 | 20 | 10 | 10 | 20 | 20 | 20 | 10 | 10 | 20 |
| Content (vol %) | 30 | 50 | 30 | 50 | 40 | 30 | 50 | 30 | 50 | 40 | 30 |
| *Heat conductive filler* | | | | | | | | | | | |
| Composition | alumina | alumina | boron nitride | alumina | alumina | alumina | alumina | boron nitride | alumina | alumina | none |
| Shape | sphere | sphere | flake | sphere | sphere | sphere | sphere | flake | sphere | sphere | |
| Size (μm) | 10 | 10 | 15 | 10 | 10 | 10 | 10 | 15 | 10 | 10 | |
| Content (vol %) | 40 | 30 | 20 | 25 | 20 | 40 | 30 | 20 | 25 | 20 | |
| EM-reflecting layer | | | | | | | | | | | |
| *Electrically conductive filler* | | | | | | | | | | | |
| Composition | Ni-coated carbon fiber | copper | gold-coated silica | gold-coated silica | carbon fiber | Ni-coated carbon fiber | copper | gold-coated silica | gold-coated silica | carbon fiber | stainless steel screen |
| Shape | fiber | sphere | sphere | sphere | fiber | fiber | sphere | sphere | sphere | fiber | |
| Size (μm) | 150 | 20 | 10 | 10 | 500 | 150 | 20 | 10 | 10 | 500 | |
| Content (vol %) | 35 | 50 | 40 | 40 | 30 | 35 | 50 | 40 | 40 | 30 | |
| *Heat conductive filler* | | | | | | | | | | | |
| Composition | none | none | alumina | alumina | none | none | none | alumina | alumina | none | |
| Shape | | | sphere | sphere | | | | sphere | sphere | | |
| Size (μm) | | | 1 | 1 | | | | 1 | 1 | | |
| Content (vol %) | | | 30 | 30 | | | | 30 | 30 | | |
| Layer thickness (mm), absorbing layer/reflecting layer or absorbing layer/reflecting layer/absorbing layer | 1.0/0.3 | 1.0/0.3 | 1.0/0.3 | 1.0/0.3 | 1.0/0.3 | 1.0/0.3/1.0 | 1.0/0.3/1.0 | 1.0/0.3/1.0 | 1.0/0.3/1.0 | 1.0/0.3/1.0 | 1.0/0.1/1.0 |

The sheets obtained in Examples 1–10 and Comparative Example 1 were evaluated for the attenuation of EM being transmitted, the attenuation of radiated noise as the EM absorbing property, heat conductivity, heat resistance and flexibility. The results are shown in Table 2.

Figure 3:
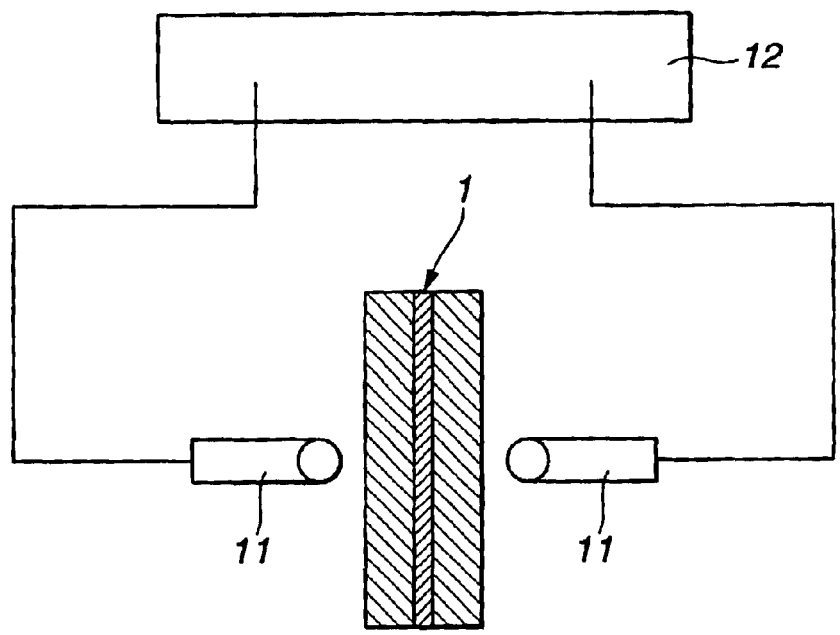
FIG. 3 is a diagram showing a method of measuring the attenuation effect of electromagnetic wave being transmitted.

The attenuation effect of EM being transmitted was determined using a measurement system as shown in FIG. 3. A sheet 1 was disposed between microwave loop antennas having a diameter of 1.5 mm serving as an EM source 11 and a detector 11. The output of the detector 11 was measured by a network analyzer 12. The sheet 1 of EM absorber was dimensioned 100 mm square. The attenuation of 1 GHz frequency EM being transmitted is reported as a representative.

Figure 4:
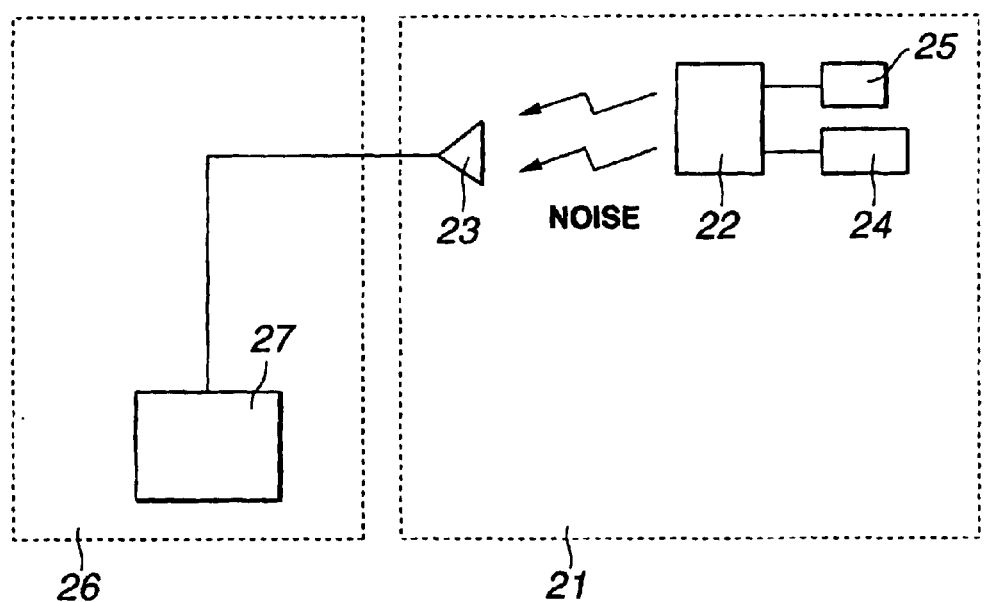
FIG. 4 is a diagram showing a method of evaluating noise attenuation.

The attenuation of radiated noise was determined using a system as shown in FIG. 4. Disposed in an electromagnetic dark chamber 21 was a personal computer 22 in which a strip of 50 mm square cut from the EM absorber was interposed between a CPU chip (operating frequency 1 GHz) and an aluminum heat sink. A receiver antenna 23 was located in the chamber and spaced 3 m from the PC for measuring the quantity of radiated electromagnetic noise. This setting complies with the 3-m testing according to the Federal Communications Commission (FCC). The noise generated from the operating PC was measured by an EMI receiver 27 (connected to the antenna 23) in a shielded chamber 26. The difference between this noise measurement and the noise generated when the EM absorber is omitted is the noise attenuation. The attenuation of frequency 1 GHz noise is reported as a representative. It is noted that in FIG. 4, the computer 22 is connected to a display 24 and a keyboard 25.

Heat resistance was evaluated by heating a sheet of the EM absorber in an oven at 150° C. and a pressure of 0.1 MPa for compression and allowing the sheet to stand for 24 hours. A change of sheet thickness was measured.

Flexibility was evaluated by wrapping a 50-mm wide sheet of the EM absorber around a 10-mm diameter rod and visually observing the outer appearance.

Rubber hardness was measured by molding sheets of 6 mm thick from the respective materials used to form the EM-absorbing and reflecting layers, stacking the two sheets to form a laminate having a total thickness of 12 mm, and measuring the Asker C hardness of the laminate.

TABLE 2

| Evaluation | Heat conductivity (W/mK) | Attenuation of transmitting EM (dB) | Noise attenuation (dB) | Heat resistance, thickness change (%) | Flexibility | Asker C hardness EM-absorbing layer | Asker C hardness EM-reflecting layer |
|---|---|---|---|---|---|---|---|
| EX1 | 3.1 | 43 | 13.1 | −9 | good | 40 | 50 |
| EX2 | 10.6 | 37 | 9.8 | −8 | good | 60 | 60 |
| EX3 | 5.3 | 38 | 12.3 | −6 | good | 30 | 45 |
| EX4 | 4.7 | 35 | 7.3 | −7 | good | 40 | 45 |
| EX5 | 2.1 | 22 | 5.5 | −11 | good | 25 | 50 |
| EX6 | 3.3 | 45 | 12.9 | −9 | good | 50 | 50 |
| EX7 | 10.1 | 39 | 10.1 | −9 | good | 65 | 60 |
| EX8 | 5.1 | 39 | 13.8 | −8 | good | 40 | 45 |
| EX9 | 4.9 | 35 | 8.5 | −10 | good | 40 | 45 |
| EX10 | 1.9 | 25 | 4.3 | −15 | good | 20 | 50 |
| CE1 | 0.6 | 41 | 13.2 | −66 | poor | — | — |

Examples 11–12

EM absorbers of the integrated two-layer structure consisting of the EM-absorbing layer and the EM-reflecting layer were obtained as in Examples 1–5 except that the heat conductive filler was omitted.

The composition and thickness of the EM-absorbing layer and the EM-reflecting layer are shown in Table 3.

Comparative Example 2

By using a polyester fiber fabric having nickel and copper electroless plated thereon as the EM-reflecting layer, and coating a chlorinated polyethylene rubber filled with an EM-absorbing filler to one surface of the fabric to form an EM-absorbing layer, an EM absorber of the two-layer structure was obtained.

The composition and thickness of the EM-absorbing layer and the EM-reflecting layer are shown in Table 3.

TABLE 3

|  | Example 11 | Example 12 | Comparative Example 1 |
|---|---|---|---|
| Layer construction | | | |
| EM-absorbing layer | | | |
| EM-absorbing filler | | | |
| Composition | Mn—Zn ferrite | Mn—Zn ferrite | Mn—Zn ferrite |
| Shape | granule | granule | granule |
| Size (μm) | 10 | 10 | 10 |
| Content (vol %) | 40 | 60 | 60 |
| Heat conductive filler | | | |
| Composition | none | none | none |
| Shape | | | |
| Size (μm) | | | |
| Content (vol %) | | | |
| EM-reflecting layer | | | |
| Electrically conductive filler | | | |
| Composition | carbon fiber | Ni-coated carbon fiber | Ni—Cu electroless plated polyester |
| Shape | fiber | fiber | fiber |

TABLE 3-continued

|  | Example 11 | Example 12 | Comparative Example 1 |
|---|---|---|---|
| Layer construction | | | |
| Size (μm) | 500 | 150 | fiber |
| Content (vol %) | 30 | 35 | fabric |
| Heat conductive filler | | | |
| Composition | none | none | |
| Shape | | | |
| Size (μm) | | | |
| Content (vol %) | | | |
| Layer thickness (mm), absorbing layer/reflecting layer | 2.0/0.5 | 2.5/0.5 | 2.5/0.1 |

The sheets obtained in Examples 11–12 and Comparative Example 2 were evaluated for the attenuation of reflected EM as a typical EM-absorbing property. The peak frequency of reflected EM attenuation and the attenuation at that frequency are reported as a representative. As one index of weather resistance, ozone resistance was evaluated by exposing the sheet to an atmosphere containing 100 ppm of ozone at 40° C. for 100 hours, and examining the flexibility of the sheet in accordance with the test procedure used in Examples 1–10. The results are shown in Table 4.

TABLE 4

| Evaluation | Noise attenuation Attenuation (dB) | Noise attenuation Peak frequency (GHz) | Flexibility after ozone exposure |
|---|---|---|---|
| Example 11 | 23 | 8.7 | good |
| Example 12 | 28 | 5.3 | good |
| Compararive Example 2 | 26 | 5.5 | poor |

Examples 1–10 (and Comparative Example 1) are given to demonstrate the potential application of the inventive EM absorber to near fields as found within electronic equipment whereas Examples 11–12 (and Comparative Example 2) are given to demonstrate the potential application of the inventive EM absorber to far fields (plane waves) as a countermeasure to television ghost by buildings, ship radar ghost by bridges, etc. The EM absorbers within the scope of the invention ensure better results in both the applications.

Japanese Patent Application No. 2001-135773 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An electromagnetic wave absorber comprising
an electromagnetic wave reflecting layer having an electrically conductive filler dispersed in a silicone resin, and
an electromagnetic wave absorbing layer having an electromagnetic wave absorbing filler dispersed in a silicone resin, laminated on at least one surface of said reflecting layer
wherein said electromagnetic wave absorbing layer has a volume resistivity of at least $1 \times 10^2$ $\Omega$m.

2. The electromagnetic wave absorber of claim 1 wherein said silicone resin is a silicone rubber, silicone gel or unvulcanized putty silicone composition.

3. The electromagnetic wave absorber of claim 1 wherein at least one of said electromagnetic wave reflecting layer and said electromagnetic wave absorbing layer further contains a heat conductive filler.

4. The electromagnetic wave absorber of claim 1 wherein the electromagnetic wave absorbing filler is a soft magnetic alloy containing at least 15% by volume of iron.

5. The electromagnetic wave absorber of claim 1 wherein the electromagnetic wave absorbing filler is ferrite.

6. The electromagnetic wave absorber of claim 1 wherein the silicone resin has the formula:

$$R^1_n SiO_{(4-n)/2}$$

wherein
$R^1$ is a monovalent hydrocarbon radical having 1 to 10 carbon atoms; and
"n" is a positive number from 1.98 to 2.2.

7. The electromagnetic wave absorber of claim 6 wherein $R^1$ is a member selected from the group consisting of methyl, ethyl, isopropyl, butyl, isobutyl, tert-butyl, hexyl, octyl, cyclohexyl, vinyl, phenyl, tolyl, benzyl, phenylethyl and phenylpropyl.

8. The electromagnetic wave absorber of claim 6 wherein $R^1$ is substituted with halogen and/or cyano.

9. The electromagnetic wave absorber of claim 1 wherein the silicone resin has the formula:

$$R^2_a H_b SiO_{(4-a-b)/2}$$

wherein:
$R^2$ is a substituted or unsubstituted monovalent hydrocarbon radical of 1 to 10 carbon atoms;
"a" is a number from 0 to 3;
"b" is a number from more than 0 to 3; and
"a" and "b" satisfy the equation: $0 < a+b \leq 3$.

10. The electromagnetic wave absorber of claim 9 wherein "a" and "b" satisfy the equation:

$$0.8 \leq a+b \leq 3.0.$$

11. The electromagnetic wave absorber of claim 1 wherein the electromagnetic wave absorbing filler is a soft magnetic alloy containing at least 15% by volume of iron, and ferrite.

12. The electromagnetic wave absorber of claim 1 wherein the electromagnetic wave absorbing filler is selected from the group consisting of $MnFe_2O_4$, $CoFe_2O_4$, $NiFe_2O_4$, $CuFe_2O_4$, $ZnFe_2O_4$, $MgFe_2O_4$, $Fe_3O_4$, Cu—Zn-ferrite, Ni—Zn-ferrite, and Mn—Zn-ferrite.

13. The electromagnetic wave absorber of claim 1 wherein the electromagnetic wave absorbing filler is $Ba_2Me_2Fe_{12}O_{22}$; wherein Me is Co, Ni, Zn, Mn, Mg or Cu.

14. The electromagnetic wave absorber of claim 1 wherein the electromagnetic wave absorbing filler is $Ba_3Co_2Fe_{24}O_{41}$.

15. The electromagnetic wave absorber of claim 1 wherein the electromagnetic wave absorbing filler is present in the form of particles having a mean particle size of about 0.1 $\mu$m to about 100 $\mu$m.

16. The electromagnetic wave absorber of claim 1 wherein the electromagnetic wave absorbing filler comprises from 5 to 80% by volume of the entire electromagnetic wave absorbing layer.

* * * * *